United States Patent
Xi et al.

(10) Patent No.: US 10,164,535 B2
(45) Date of Patent: Dec. 25, 2018

(54) CYCLE-BY-CYCLE PEAK CURRENT LIMITING IN CURRENT MODE BUCK/BOOST CONVERTERS

(71) Applicant: TEXAS INSTRUMENTS INCORPORATED, Dallas, TX (US)

(72) Inventors: Youhao Xi, Chandler, AZ (US); Eric Wayne Tisinger, Chandler, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/822,110

(22) Filed: Nov. 24, 2017

(65) Prior Publication Data

US 2018/0145593 A1    May 24, 2018

Related U.S. Application Data

(60) Provisional application No. 62/426,056, filed on Nov. 23, 2016.

(51) Int. Cl.

| | |
|---|---|
| H02M 3/158 | (2006.01) |
| H03K 5/08 | (2006.01) |
| G06F 1/26 | (2006.01) |
| H02M 3/335 | (2006.01) |
| G05F 1/24 | (2006.01) |
| H02M 1/32 | (2007.01) |
| H02M 3/156 | (2006.01) |
| H02M 1/00 | (2006.01) |

(52) U.S. Cl.
CPC ............ *H02M 3/1582* (2013.01); *G05F 1/24* (2013.01); *G06F 1/263* (2013.01); *H02M 1/32* (2013.01);
(Continued)

(58) Field of Classification Search
CPC .... H02M 3/155–3/158; H02M 3/1582; H02M 1/32; H02M 2001/009; G05F 1/10;
(Continued)

(56) References Cited

U.S. PATENT DOCUMENTS

9,391,517 B1 * 7/2016 Pazhayaveetil ........ H03G 3/004
2007/0296389 A1 * 12/2007 Chen ...................... H02M 3/158
323/290
(Continued)

*Primary Examiner* — Adolf Berhane
(74) *Attorney, Agent, or Firm* — Andrew Viger; Charles A. Brill; Frank D. Cimino (57) ABSTRACT

An SMPS current mode control loop with an adjusted cycle-by-cycle peak current limit for buck and boost (and bidirectional buck/boost) regulators. An SMPS regulator can include a PWM driver to drive switching control signals with a PWM duty cycle to an output terminal OUT, and a PWM controller to control the PWM duty cycle based on a current mode control loop that includes slope compensation to provide a signal VPK corresponding to a current sense signal from a current sense terminal CS, based on sensed peak current through the energy storage element, superimposed with an injected slope compensation current corresponding to a predefined slope compensation based on PWM duty cycle. Adjusted peak limit circuitry generates a signal VLMT corresponding to an adjusted peak current limit based on a pre-defined peak current limit threshold for the energy storage element, including generating a peak limit adjustment current corresponding to the injected slope compensation current, and combining the peak limit adjustment current with the pre-defined peak current limit threshold so that VLMT is substantially constant.

20 Claims, 5 Drawing Sheets

(52) U.S. Cl.
CPC ....... *H02M 3/156* (2013.01); *H02M 3/33584* (2013.01); *H03K 5/086* (2013.01); *H02M 2001/0009* (2013.01); *H02M 2001/0025* (2013.01)

(58) Field of Classification Search
CPC ..... G05F 1/12; G05F 1/24; G05F 1/40; G05F 1/44
USPC .......................... 323/265, 271, 282–285, 351
See application file for complete search history.

(56) References Cited

U.S. PATENT DOCUMENTS

| | | | |
|---|---|---|---|
| 2010/0085029 A1* | 4/2010 | Xie | H02M 3/156 323/299 |
| 2011/0018515 A1* | 1/2011 | McCloy-Stevens | H02M 3/1588 323/284 |
| 2011/0215784 A1* | 9/2011 | Hoogzaad | H02M 3/156 323/285 |
| 2012/0074917 A1* | 3/2012 | Chao | H02M 3/155 323/282 |
| 2014/0375286 A1* | 12/2014 | Jiang | H02M 3/156 323/271 |
| 2015/0061624 A1* | 3/2015 | Lalithambika | H02M 3/156 323/282 |
| 2015/0338862 A1* | 11/2015 | Shin | G05F 1/46 323/281 |
| 2016/0261258 A1* | 9/2016 | van Eeden | H03K 19/21 |
| 2016/0373002 A1* | 12/2016 | Borfigat | H02M 1/32 |

\* cited by examiner

CYCLE-BY-CYCLE PEAK CURRENT LIMITING IN CURRENT MODE BUCK/BOOST CONVERTERS

CROSS-REFERENCE TO RELATED APPLICATIONS

Priority is claimed under 37 CFR 1.78 and 35 USC 119(e) to U.S. Provisional Application 62/426,056, filed 2016 Nov. 23, which is incorporated in its entirety by reference.

BACKGROUND

Technical Field

This Patent Disclosure relates to switch mode power supplies, and more particularly to switched mode power supplies, regulators, converters/switchers, and controllers with current mode switching control.

Related Art

Switched mode power supply (SMPS) topologies, such as buck, boost, or bidirectional buck/boost, can use voltage mode or current mode control for PWM (pulse width modulation) switching of the power transistor(s). Current mode control regulates peak (inductor) current with an inner current control loop.

Current mode control for PWM switching can use cycle-by-cycle peak current limiting to prevent over loading and saturating the power inductor (or transformer). Sensed inductor current is compared with a defined peak current limit (reference), and the peak current limit comparator terminates the PWM duty cycle whenever sensed current (and the addition of slope compensation) exceeds the peak current limit threshold.

Slope compensation is used to stabilize the current mode control for duty cycles greater than 50%, avoiding subharmonic oscillation. Two Equivalent slope compensation approaches are (a) slope compensation superimposed onto the sensed current signal, and (b) slope compensation subtracted from the comparator reference voltage.

In either approach, slope compensation, which increases with increasing duty cycle, is effectively added to the sensed current prior to current limit comparison. As a result, the actual peak current limit varies with duty cycle, with the actual peak current limit decreasing with increasing duty cycle.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods cycle-by-cycle peak current limit adjustment in current mode buck and boost regulators (including bidirectional buck/boost regulators).

According to aspects of the Disclosure, a circuit for use in a switched mode power supply for generating a regulated output voltage, and including at least one power switching transistor, and an energy storage element. The circuit can include a PWM driver to drive switching control signals with a PWM (pulse-width modulated) duty cycle to an output terminal OUT, and a PWM controller to control the PWM duty cycle, including a current mode control loop that includes slope compensation circuitry to provide a signal VPK, and adjusted peak limit circuitry to generate a signal VLMT. The slope compensation circuitry can provide the signal VPK corresponding to a current sense signal from a current sense terminal CS, based on sensed peak current through the energy storage element, superimposed with an injected slope compensation signal corresponding to a pre-defined slope compensation based on PWM duty cycle. The adjusted peak limit circuitry can generate the signal VLMT corresponding to an adjusted peak current limit based on a pre-defined peak current limit threshold for the energy storage element, including circuitry to generate a peak limit adjustment current corresponding to the injected slope compensation current, and to combine the peak limit adjustment current with the pre-defined peak current limit threshold so that VLMT is substantially constant.

Other aspects and features of the invention claimed in this Patent Document will be apparent to those skilled in the art from the following Disclosure.

BRIEF DESCRIPTION OF THE DRAWINGS

FIGS. 2A-2B provide example waveforms for the sensed peak current [211], plus slope injection [213], where the amount of injected slope compensation current varies with VIN and Duty Cycle (D) (D<50% with lower VIN, and D>50% with higher VIN)

FIG. 3 illustrates an example of adjusted cycle-by-cycle peak current limiting according to this Disclosure, implemented as an alternate example buck regulator [300] (controller or converter/switcher) with current mode control that includes a peak current control loop [310, 320, 330], using voltage controlled current sources [315, 325] including slope compensation [310] with ramp current [302, 315] superimposed on the sense current CS [301] to provide VPK, and VREF Adjust [320] including a current source IDC=a·$V_O$ [VCCS 325] to provide VLMT, with VPK and VLMT input to a peak current limit comparator PK LMT [330], and with VREF Adjust adjusting the peak current limit threshold VREF to compensate for the injected slope-compensation current so that VLMT remains constant according to aspects of this Disclosure.

FIG. 4 illustrates an example of adjusted cycle-by-cycle peak current limiting according to this Disclosure, implemented as an example boost regulator [400] (controller or converter/switcher) with current mode control that includes a peak current control loop [410, 420, 430], using voltage controlled current sources [415, 425] including slope compensation [410] with ramp current [402, 415] superimposed on the sense current CS [401] to provide VPK, and VREF Adjust [420] including a current source $I_{DC}=a \cdot (V_O-V_{IN})$ [VCCS 425] to provide VLMT, with VPK and VLMT input to a peak current limit comparator PK LMT [430], and with VREF Adjust adjusting the peak current limit threshold VREF to compensate for the injected slope-compensation current so that VLMT remains constant according to aspects of this Disclosure.

FIGS. 5A-5B illustrate an example of adjusted cycle-by-cycle peak current limiting according to this Disclosure, in an example implementation of a bidirectional buck/boost regulator [500], with 12V and 48V input voltage rails, with current mode control that includes a peak current control loop [515, 520, 530], using voltage controlled current sources [515, 525A/525B] including slope compensation [510] with ramp current ISLP [502, 515] superimposed on the sense current CS [through buffer 513] to provide VPK, and VREF Adjust [520] including V12 and V48 voltage controlled current sources [VCCS 525A, 525B] to provide VLMT, with VPK and VLMT input to a peak current limit comparator PK LMT [530], and with VREF Adjust adjusting the peak current limit threshold VREF to compensate for the injected slope-compensation current so that VLMT remains constant according to aspects of this Disclosure.

FIGS. 6A-6B illustrate an example of adjusted cycle-by-cycle peak current limiting according to this Disclosure, implemented as an example buck SMPS with a buck PWM controller [600]

DETAILED DESCRIPTION

This Description and the Drawings constitute a Disclosure for adjusted cycle-by-cycle peak current limit in current mode buck/boost regulators, such as for use in buck/boost SMPS (switched mode power supplies), including describing design examples (example implementations), and illustrating various technical features and advantages.

A switched mode power supply (SMPS) transfers power from an input power source to a load by switching one or more power transistors coupled through a switch node/terminal to an energy storage element (such as an inductor/transformer or capacitor), which is coupled to the load. An SMPS regulator includes an SMPS controller to provide gate drive to the power transistor(s), which can be external, or integrated with the controller as an SMPS switcher/converter (with a switch node output terminal). In common configurations/topologies (such as buck, boost, and bidirectional buck/boost), the SMPS includes, in addition to the energy storage element, an output/bulk capacitor in parallel with the load, and the SMPS regulator switches the power transistor(s) to form circuit arrangements (at the switch node) with the energy storage element to supply load current to the load, and to the output/bulk capacitor to maintain a regulated output voltage. For example, an SMPS regulator can be coupled through the switch node/terminal to a power (energy storage) inductor/transformer, which is switched between charge and discharge cycles, based on a PWM (pulse width modulated) duty cycle, to supply inductor current to the load, and to output/bulk capacitor (filter) to maintain the regulated output voltage. An SMPS regulator can be configured for operation as a constant current source, with an energy storage element, but with no output/bulk capacitor.

Current mode control uses cycle-by-cycle peak current limiting to prevent over loading and saturating the power inductor (or transformer). Slope compensation is used to stabilize the current mode control for duty cycles greater than 50%, avoiding subharmonic oscillation. Slope compensation, which increases with increasing duty cycle, is effectively added to the sensed current prior to current limit comparison. As a result, the actual peak current limit varies with duty cycle, with the actual peak current limit decreasing with increasing duty cycle, unless compensated by an adjusted peak current limit according to this Disclosure.

For example, the difference between a pre-defined peak current limit VREF and the actual peak current limit after slope injection can result in an over-designed power inductor/transformer. Specifically, the power inductor/transformer would be designed to support the highest peak current under small duty cycle (maximum power capability also varies with duty cycle). For an example buck regulator, if VIN=5.5V to 48V and VO regulated to 5.0V, and with FSW=200 kHz, then Lm=4.7 uH, Isat=10 A, and the peak current limit threshold is VREF=50 Mv, with a max Ipk=10 A. For this example, to maintain VOUT=5V regulation, a 10 Apk inductor is indicated, even though the specified operating range is only 27.8 W, or 5.8 Adc load current. That is, a 10 Apk inductor is indicated for 5.8 A load application.

In brief overview, an SMPS current mode control loop with an adjusted cycle-by-cycle peak current limit for buck and boost (and bidirectional buck/boost) regulators. An SMPS regulator can include a PWM driver to drive switching control signals with a PWM duty cycle to an output terminal OUT, and a PWM controller to control the PWM duty cycle based on a current mode control loop that includes slope compensation to provide a signal VPK corresponding to a current sense signal from a current sense terminal CS, based on sensed peak current through the energy storage element, superimposed with an injected slope compensation current corresponding to a predefined slope compensation based on PWM duty cycle. Adjusted peak limit circuitry generates a signal VLMT corresponding to an adjusted peak current limit based on a pre-defined peak current limit threshold for the energy storage element, including generating a peak limit adjustment current corresponding to the injected slope compensation current, and combining the peak limit adjustment current with the pre-defined peak current limit threshold so that VLMT is substantially constant. That is, the peak current limit reference VREF is adjusted to compensate for slope-compensation current injection that is superimposed on the nominal VREF, which otherwise would cause the actual peak current limit to increase with increasing VIN (decreasing duty cycle), maintaining actual inductor peak current limit constant.

In the above buck regulator example, with the same inductor, 38 W, or 7.6 A load current, can be specified in the entire operating range without sacrificing the VOUT=5V regulation. And, for a maximum load of 28 W, only 8 Apk inductor is needed.

Figure 1:
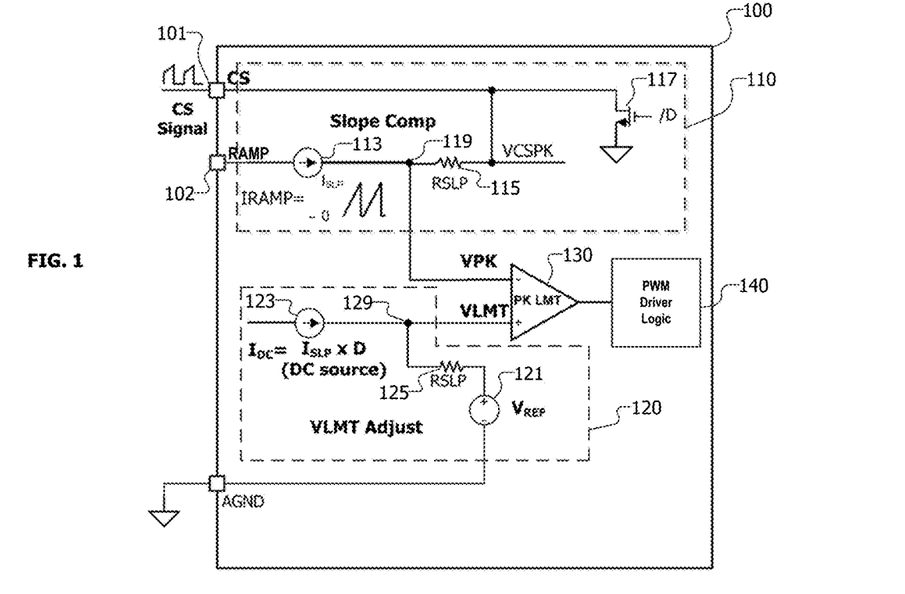
FIG. 1 illustrates an example of adjusted cycle-by-cycle peak current limiting according to this Disclosure, implemented in an example current mode buck regulator [100] (controller or converter/switcher) with current mode control that includes a peak current control loop, including slope compensation [110] with ramp current [113] superimposed on the sense current CS [101] to provide VPK, and VREF Adjust [120] including a current source IDC=ISLP×D to provide VLMT, with VPK and VLMT input to a peak current limit comparator PK LMT [130], and with VREF Adjust adjusting the peak current limit threshold VREF to compensate for the injected slope-compensation current so that VLMT remains constant according to aspects of this Disclosure.

FIG. 1 illustrates an example of adjusted cycle-by-cycle peak current limiting according to this Disclosure, implemented in an example current mode buck regulator 100 (controller or converter/switcher), with current mode control including slope compensation 110. Current mode control includes a peak current control loop with slope compensation 110 providing VPK, and VREF Adjust 120 providing VLMT to a peak current limit comparator PK LMT 130. PK LMT 130 provides a peak current limit signal to PWM driver logic 140, which provides PWM gate drive signals to the power transistor(s) (see, for example FIG. 6A).

Slope compensation 110 includes ramp current ISLP 113 superimposed on the sense current receive through CS terminal 101 at node 119, providing VPK. VREF Adjustment 120 includes a current source IDC=ISLP×D (Duty Cycle) to provide an adjusted VREF as VLMT. VPK and VLMT are input to the peak current limit comparator PK LMT 130.

According to aspects of this Disclosure, VREF Adjust 120 adjusts the pre-defined peak current limit threshold VREF 121 to compensate for the injected slope-compensation current, superimposing the peak adjustment current IDC=ISLP×D at node 129, so that VLMT remains substantially constant.

Figure 2A:
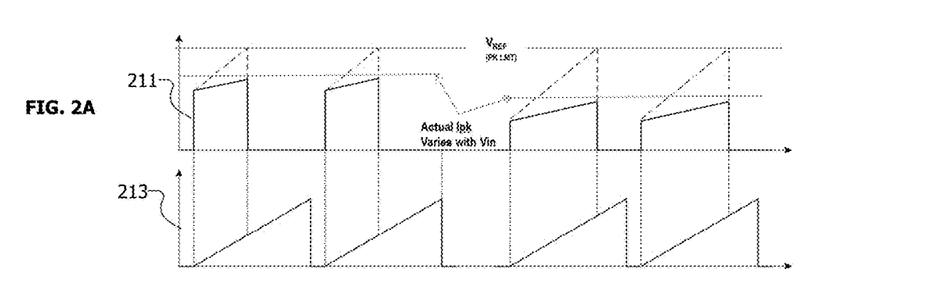
FIG. 2A illustrates VLMT=VREF, where the actual peak current limit varies with VIN.
Figure 2B:
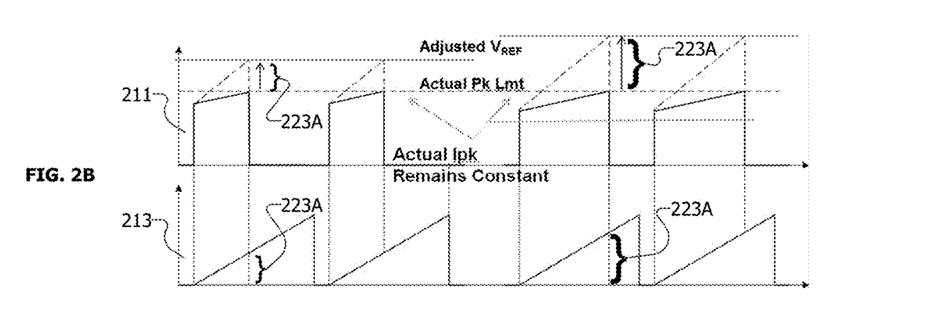
FIG. 2B illustrates VLMT=Adjusted VREF based on compensation for slope injection with a superimposed peak current adjustment IDC=ISLP×D [223A], so that VLMT remains constant.

FIGS. 2A-2B provide example waveforms for the sensed peak current CS 211, plus slope injection 213, where the amount of injected slope compensation current varies with VIN and Duty Cycle D: D<50% with lower VIN, and D>50% with higher VIN. FIG. 2A illustrates the effect of VLMT=VREF, where the actual peak current limit varies with VIN.

FIG. 2B illustrates adjusting VLMT according to this Disclosure. VREF is adjusted to compensate for slope injection with a superimposed peak current adjustment 223A: IDC=ISLP×D. Based on the adjustment to VREF, the peak current limit VLMT remains substantially constant over duty cycle (VIN).

Referring to FIGS. 1 and 2B, peak current limit adjustment is based on generating a DC current source:

$$I_{dc} = I_{SLP} \cdot D = I_{SLP} \cdot \frac{V_O}{V_{IN}}.$$

For the example buck regulator: peak inductor current is VCSPK; slope injection current (213 A) is ISLP(t)= ISLP·fsw·t; the injection resistor is $R_{SLP}$; the peak current limit reference is VLMT. That is, slope compensation is based on injecting a saw-tooth ramp current through a series resistor RSLP. Duty Cycle $$D = \frac{V_O}{V_{IN}},$$

which is $f_{sw} \cdot t_{ON}$, so that slope comp at the end of $t_{ON}$ corresponds to $$V_{PK} = V_{CSPK} + I_{SLP} \cdot R_{SLP} \cdot \frac{V_O}{V_{IN}}.$$

In order to achieve constant PK current: $V_{CSPK}=V_{REF}$. VREF Adjust generates a DC current source corresponding to $$I_{dc} = I_{SLP} \cdot D = I_{SLP} \cdot \frac{V_O}{V_{IN}}.$$

This implementation of VREF Adjust requires a multiplier/divider

Figure 3:
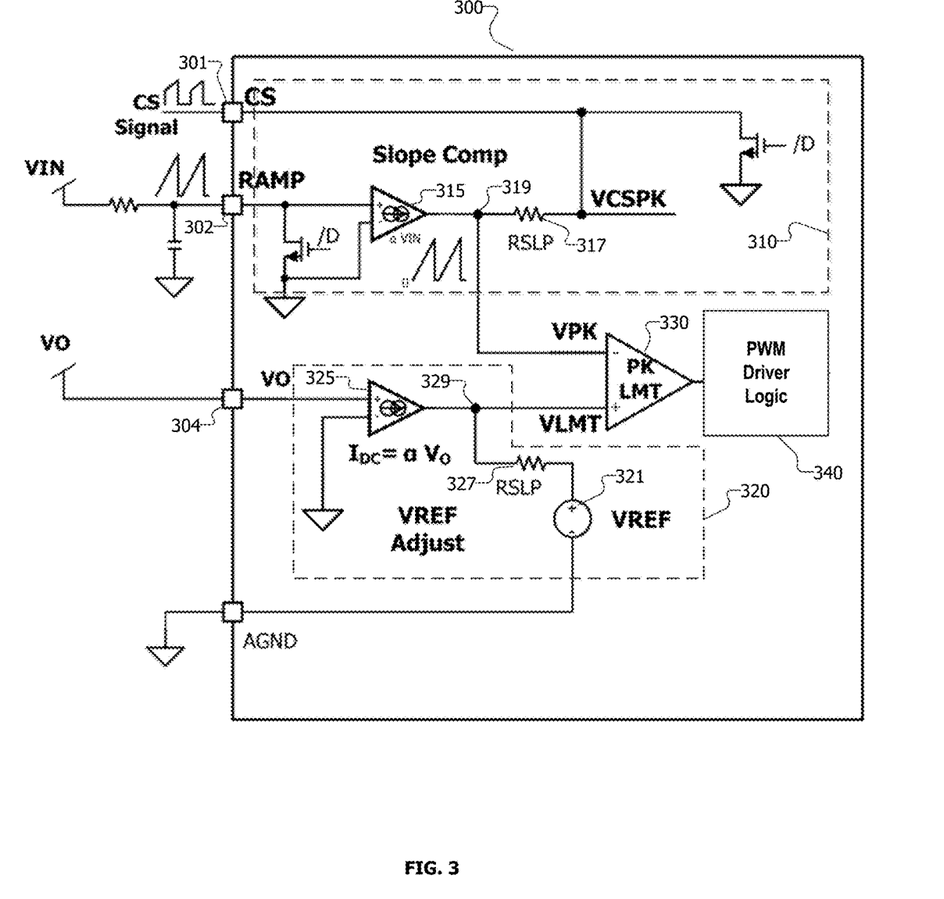

FIG. 3 illustrates an alternate example buck regulator, implementing adjusted cycle-by-cycle peak current limiting according to this Disclosure. Buck regulator 300 (controller or converter/switcher) implements current mode control with a peak current control loop, using voltage controlled current sources (VCCS) 315, 325 (transconductance gm amplifier).

A peak current control loop includes slope compensation 310 with VCCS 315, and VREF Adjust 320 with VCCS 325. Slope compensation 310 generates a ramp current with VCCS 315, superimposed at node 319 onto sense current CS (301), to provide VPK. VREF Adjust 320 generates a DC current $I_{DC}=a \cdot V_O$, to provide VLMT. VPK and VLMT are input to peak current limit comparator PK LMT 330. According to aspects of this Disclosure, VREF Adjust generates an adjusted peak current limit threshold VLMT to compensate for the injected slope-compensation current, so that VLMT remains substantially constant.

Slope compensation 310, VCCS 315, converts a ramp current 302 based on VIN to a current $ISLP=aV_{IN}$, to provide VPK. VREF Adjust 320, VCCS 325, converts VOUT to a DC constant current $IDC=a \cdot V_O$, to provide VLMT.

VCCS conductance a is pre-defined, and used to convert the input voltage signal into current signal. Once alpha is defined, the same conductance is used for both VCCS's, slope compensation 315, and VREF Adjust 325. As a result, the effects of slope compensation on the actual peak current limit is cancelled by VREF Adjust, leading to a substantially constant peak current limit VLMT.

Slope compensation 410 generates a saw-tooth ramp current $ISLP(t)=a \cdot V_{IN} \cdot f_{sw} \cdot t$. VREF Adjust 420 generates a DC current source $I_{DC}=a \cdot V_O$. Duty cycle is $$D = \frac{V_O}{V_{IN}},$$

which is $f_{sw} \cdot t_{ON}$. Slope compensation corresponds to $V_{PK}=V_{CSPK} \cdot R_{SLP} \cdot \alpha \cdot V_O$. Adjusted VREF is $V_{LMT}=V_{REF}+ R_{SLP} \cdot \alpha \cdot V_O$. The resulting adjusted peak current limit is $V_{CSPK}=V_{REF}$.

Figure 4:
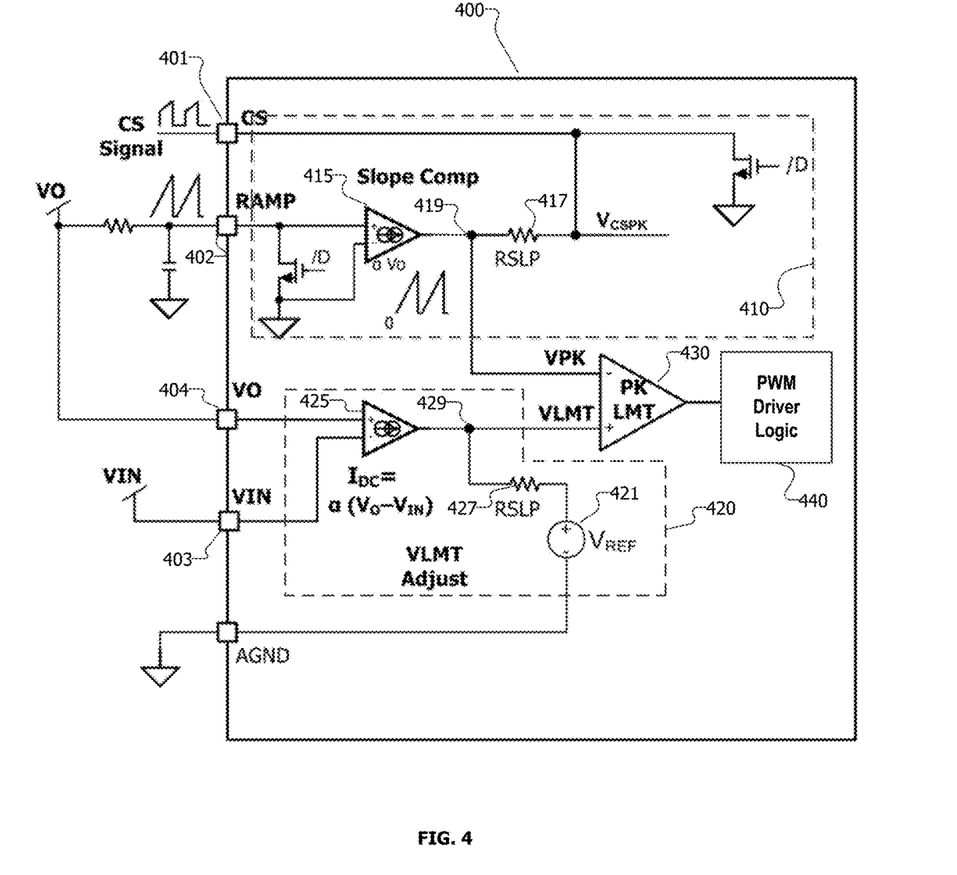

FIG. 4 illustrates an example of adjusted cycle-by-cycle peak current limiting according to this Disclosure, implemented as an example current mode boost regulator 400 (controller or converter/switcher). Boost regulator 400 implements current mode control with a peak current control loop, using voltage controlled current sources (VCCS) 415 and 425 (transconductance gm amplifiers)

A peak current control loop includes slope compensation 410 with VCCS 415, and VREF Adjust 420 with VCCS 425. Slope compensation 410 generates a ramp current with VCCS 415, superimposed at node 419 onto sense current CS (401), to provide VPK. VREF Adjust 420 generates a DC current $I_{DC}=a \cdot (V_O-V_{IN})$, to provide VLMT. VPK and VLMT are input to peak current limit comparator PK LMT 430. According to aspects of this Disclosure, VREF Adjust generates an adjusted peak current limit threshold VLMT to compensate for the injected slope-compensation current, so that VLMT remains substantially constant.

Slope compensation 410, VCCS 415, converts a ramp current 402 based on VOUT to a current $aV_O$, to provide VPK. VREF Adjust 420, VCCS 425, converts VOUT and VIN to a DC constant current $IDC=a \cdot (V_O-V_{IN})$, to provide VLMT.

VCCS conductance a is pre-defined, and used to convert the input voltage signal into current signal. Once alpha is defined, the same conductance is used for both VCCS's, slope compensation 415, and VREF Adjust 425. As a result, the effects of slope compensation on the actual peak current limit is cancelled by VREF Adjust, leading to a substantially constant peak current limit VLMT.

Slope compensation 410 generates a saw-tooth current corresponding to $I_{SLP}(t)=a \cdot V_O \cdot f_{sw} \cdot t$. VREF Adjust 420 generates a DC current source $I_{DC}=a \cdot (V_O-V_{IN})$. Duty cycle is $$D = \frac{V_O}{V_{IN}}$$

which is $f_{sw} \cdot t_{ON}$. Slope compensation corresponds to $V_{PK}=V_{CSPK}+R_{SLP} \cdot \alpha \cdot (V_O-V_{IN})$. Adjusted VREF is $V_{LMT}=V_{REF}+R_{SLP} \cdot \alpha \cdot (V_O-V_{IN})$. The resulting adjusted peak current limit is $V_{CSPK}=V_{REF}$.

Figure 5A:
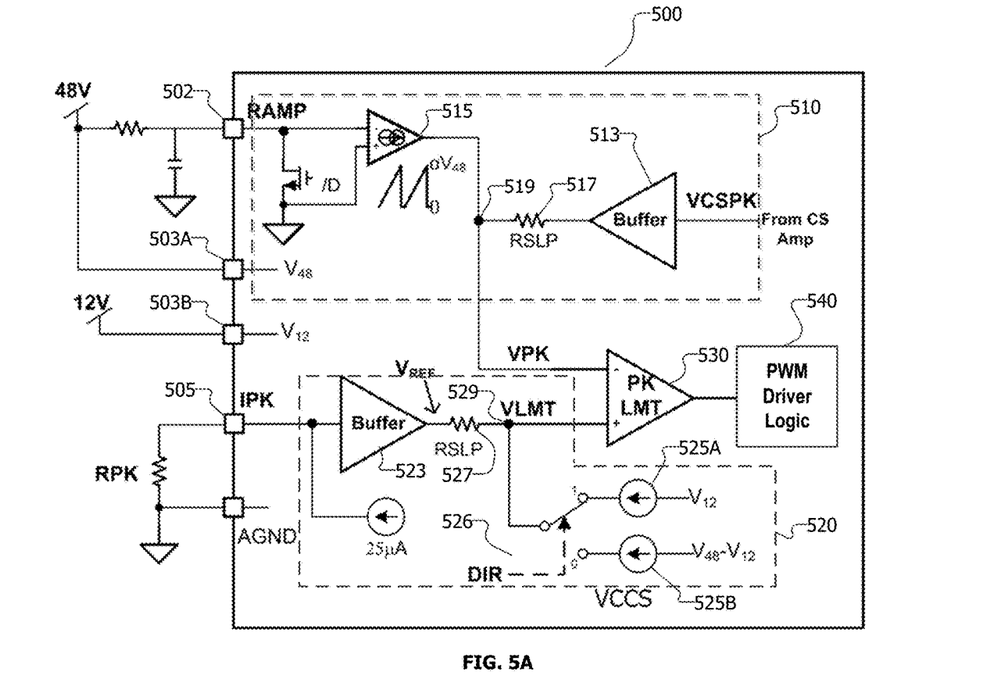
Figure 5B:
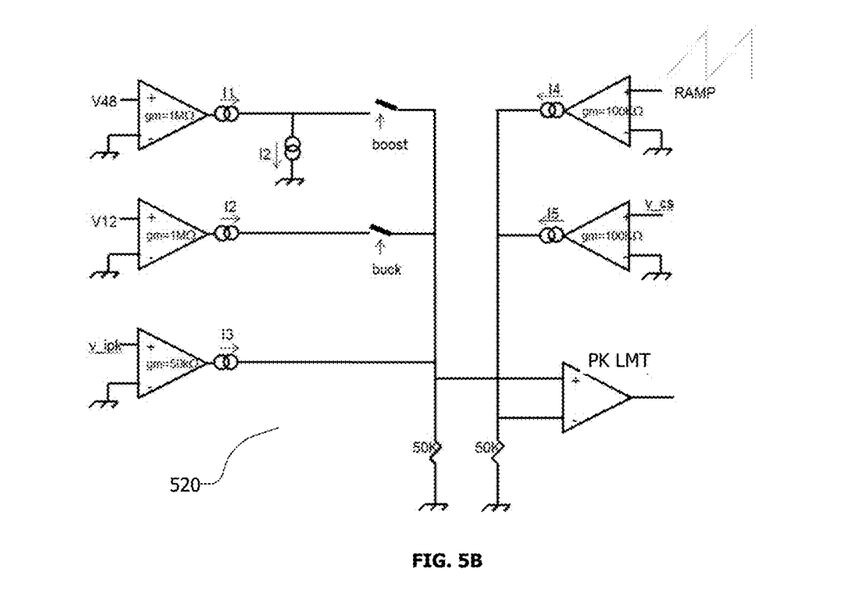

FIGS. 5A-5B illustrate an example of adjusted cycle-by-cycle peak current limiting according to this Disclosure, in an example implementation of a bidirectional buck/boost regulator 500, with 12V and 48V input voltage rails. Current mode control includes a peak current control loop, using voltage controlled current sources 515 and 525A/525B.

Slope compensation 510 generates a ramp current 502 superimposed on sense current CS through buffer 513 to provide VPK. VREF Adjust 520 includes V12 and V48 VCCS 525A and 525B] to provide VLMT. VPK and VLMT are input to a peak current limit comparator PK LMT 530, with VREF Adjust adjusting the peak current limit threshold VLMT (adjusted VREF) to compensate for the injected slope-compensation current, so that VLMT remains constant according to aspects of this Disclosure.

In Buck Mode, 48V is the input rail, and 12V the output rail. In Boost Mode, 12V is the input rail, and the 48V is the output rail. In FIG. 5B, v_ipk is the programmed current limit (external pin), and v_cs is the output of the current sense amp, The +input to the PK LMT comparator is a combination of programmed voltage (v_ipk), and a critical conduction duty cycle component, which depends on buck or boost direction.

Figure 6A:
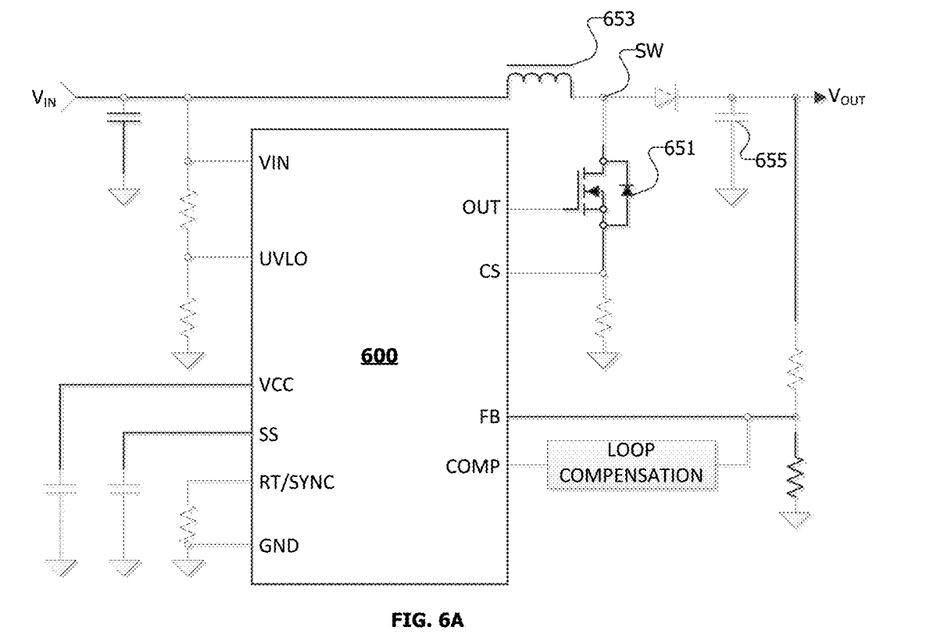
FIG. 6A illustrates an example buck SMPS, including controller [600] with terminals VIN, OUT, CS, and FB, coupled through the OUT terminal to an external power switching transistor [651], and power (buck) inductor [653] and output/bulk capacitor [655]
Figure 6B:
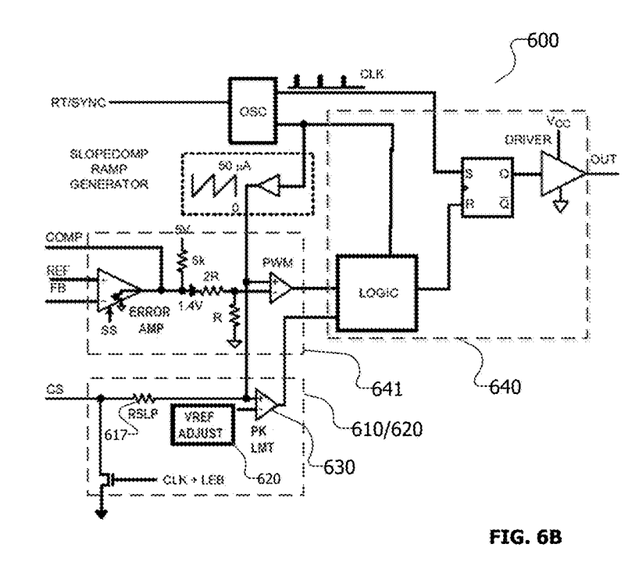
FIG. 6B illustrates PWM gate-drive control circuitry for the PWM controller, including a voltage regulation loop [641], and a peak current control loop [610/620] including VREF Adjustment [620] providing an adjusted peak current limit to a peak current limit comparator [630], according to this Disclosure.

FIGS. 6A-6B illustrate an example of adjusted cycle-by-cycle peak current limiting according to this Disclosure, implemented as an example buck SMPS with a buck PWM controller 600. FIG. 6A illustrates an example buck SMPS, including PWM controller 600 with terminals VIN, OUT, CS, and FB. PWM controller 600 is coupled through the OUT terminal to an external power switching transistor 651, coupled at a switch node SW to a power (buck) inductor 653 and output/bulk capacitor 655.

FIG. 6B illustrates PWM gate-drive control circuitry for the PWM controller 600. A voltage regulation loop 641 includes an error amplifier generating an error voltage Ve (VREF) input to a PWM comparator that also receives the slope compensation signal. A peak current control loop 610/620 includes VREF Adjustment 620 to provide an adjusted peak current limit to a peak current limit comparator 630, according to a according to this Disclosure.

Advantages of cycle-by-cycle peak current limit in buck, boost and bidirectional buck/boost regulators. Slope compensation effects on actual peak current limit resulting from injected slope compensation current are compensated or cancelled by adjusting the reference voltage corresponding to the injected slope compensation current, so that the adjusted peak current limit is constant over the input voltage (duty cycle) variations. Maintaining a substantially constant adjusted peak current limit enables full utilization of the power inductor, and avoids overdesign to account for variation in peak current limit. Example implementations of the adjusted peak current limit methodology use voltage controlled current sources (VCCS).

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit for use in a switched mode power supply (SMPS) for generating a regulated output voltage, the SMPS including at least one power switching transistor, and an energy storage element, the circuit comprising:
    a PWM driver to drive switching control signals with a PWM (pulse-width modulated) duty cycle to an output terminal (OUT);
    PWM control circuitry to control the PWM duty cycle, including a current mode control loop that includes:
        slope compensation circuitry to provide a signal (VPK) corresponding to
            a current sense signal from a current sense terminal (CS), based on sensed peak current through the energy storage element, superimposed with
            an injected slope compensation signal corresponding to a predefined slope compensation based on the PWM duty cycle; and
        adjusted peak limit circuitry to generate a peak current limit signal (VLMT) corresponding to an adjusted peak current limit threshold based on a pre-defined peak current limit for the energy storage element, and including circuitry
            to generate a peak current limit threshold adjustment signal corresponding to the injected slope compensation signal, and
            to combine the peak current limit threshold adjustment signal with the pre-defined peak current limit threshold so that VLMT is substantially constant.

2. The circuit of claim 1, wherein the SMPS is one of: a buck regulator, a boost regulator, a bi-directional regulator.

3. The circuit of claim 1, wherein the SMPS is a buck regulator, and wherein:
    the injected slope compensation signal is an injected slope compensation current;
    the peak current limit threshold adjustment signal is a peak current limit threshold adjustment current based on the injected slope compensation current multiplied by the PWM duty cycle.

4. The circuit of claim 1, wherein the SMPS is a buck regulator, and wherein:
    the injected slope compensation signal is generated by a voltage controlled current source (VCCS) with a pre-defined conductance;
    the peak current limit threshold adjustment signal is generated by a VCCS with a substantially identical pre-defined conductance; and
    the peak current limit threshold adjustment signal is based on an output voltage for the SMPS.

5. The circuit of claim 1, wherein the SMPS is a boost regulator, and wherein:

the injected slope compensation signal is generated by a voltage controlled current source (VCCS) with a pre-defined conductance;

the peak current limit threshold adjustment signal is generated by a VCCS with a substantially identical pre-defined conductance; and the peak current limit threshold adjustment signal is based on a difference between an output voltage and an input voltage for the SMPS.

6. The circuit of claim 1, wherein the SMPS is a bi-directional buck/boost regulator with high and low voltage rails, in which, for buck mode, the high voltage rail is an input rail, and the low voltage rail is an output rail, and for boost mode, the low voltage rail is the input rail and the high voltage rail is the output rail, and wherein:

the injected slope compensation signal is generated by a voltage controlled current source (VCCS) with a pre-defined conductance;

the peak current limit threshold adjustment signal is generated for the high and low voltage rails using a high voltage VCCS driven by a difference between the high voltage rail and the low voltage rail, and a low voltage VCCS driven by the low voltage rail.

7. The circuit of claim 1, wherein the PWM control circuitry further includes a voltage mode regulation.

8. The method of claim 1, wherein controlling the PWM duty cycle is further based on a voltage mode regulation loop.

9. A circuit for use in a switched mode power supply (SMPS) for generating a regulated output voltage, including an energy storage element, the circuit comprising:

at least one power switching transistor, and a PWM driver to drive switching control signals with a PWM (pulse-width modulated) duty cycle to the at least one power switching transistor;

PWM control circuitry to control the PWM duty cycle, including:

a voltage mode control loop; and a current mode control loop that includes:

slope compensation circuitry to provide a signal (VPK) corresponding to a current sense signal from a current sense terminal (CS), based on sensed peak current through the energy storage element, superimposed with an injected slope compensation signal corresponding to a predefined slope compensation based on the PWM duty cycle; and adjusted peak limit circuitry to generate a peak current limit signal (VLMT) corresponding to an adjusted peak current limit threshold based on a pre-defined peak current limit for the energy storage element, and including circuitry to generate a peak current limit threshold adjustment signal corresponding to the injected slope compensation signal, and to combine the peak current limit threshold adjustment signal with the pre-defined peak current limit threshold so that VLMT is substantially constant.

10. The circuit of claim 9, wherein the SMPS is one of: a buck regulator, a boost regulator, a bi-directional regulator.

11. The circuit of claim 9, wherein the SMPS is a buck regulator, and wherein:

the injected slope compensation signal is an injected slope compensation current;

the peak current limit threshold adjustment signal is a peak current limit threshold adjustment current based on the injected slope compensation current multiplied by the PWM duty cycle.

12. The circuit of claim 9, wherein the SMPS is a buck regulator, and wherein:

the injected slope compensation signal is generated by a voltage controlled current source (VCCS) with a pre-defined conductance;

the peak current limit threshold adjustment signal is generated by a VCCS with a substantially identical pre-defined conductance; and the peak current limit threshold adjustment signal is based on an output voltage for the SMPS.

13. The circuit of claim 9, wherein the SMPS is a boost regulator, and wherein:

the injected slope compensation signal is generated by a voltage controlled current source (VCCS) with a pre-defined conductance;

the peak current limit threshold adjustment signal is generated by a VCCS with a substantially identical pre-defined conductance; and the peak current limit threshold adjustment signal is based on a difference between an output voltage and an input voltage for the SMPS.

14. The circuit of claim 9, wherein the SMPS is a bi-directional buck/boost regulator with high and low voltage rails, in which, for buck mode, the high voltage rail is an input rail, and the low voltage rail is an output rail, and for boost mode, the low voltage rail is the input rail and the high voltage rail is the output rail, and wherein:

the injected slope compensation signal is generated by a voltage controlled current source (VCCS) with a pre-defined conductance;

the peak current limit threshold adjustment signal is generated for the high and low voltage rails using a high voltage VCCS driven by a difference between the high voltage rail and the low voltage rail, and a low voltage VCCS driven by the low voltage rail.

15. A method for controlling a switched mode power supply (SMPS) that generates a regulated output voltage, the SMPS including at least one power switching transistor, and an energy storage element, the method comprising:

driving switching control signals with a PWM (pulse-width modulated) duty cycle to the at least one power switching transistor;

controlling the PWM duty cycle based on a current mode control loop that includes:

providing slope compensation based on a signal (VPK) corresponding to a current sense signal based on sensed peak current through the energy storage element, superimposed with an injected slope compensation signal corresponding to a predefined slope compensation based on the PWM duty cycle; and providing a peak current limit signal (VLMT) corresponding to an adjusted peak current limit threshold based on a pre-defined peak current limit for the energy storage element, including generating a peak current limit threshold adjustment signal corresponding to the injected slope compensation signal, and combining the peak current limit threshold adjustment signal with the pre-defined peak current limit threshold so that VLMT is substantially constant.

16. The method of claim 15, wherein the SMPS is one of: a buck regulator, a boost regulator, a bi-directional regulator.

17. The method of claim 15, wherein the SMPS is a buck regulator, and wherein:
- the injected slope compensation signal is an injected slope compensation current;
- the peak current limit threshold adjustment signal is a peak current limit threshold adjustment current based on the injected slope compensation current multiplied by the PWM duty cycle.

18. The method of claim 15, wherein the SMPS is a buck regulator, and wherein:
- the injected slope compensation signal is generated by a voltage controlled current source (VCCS) with a pre-defined conductance;
- the peak current limit threshold adjustment signal is generated by a VCCS with a substantially identical pre-defined conductance; and
- the peak current limit threshold adjustment signal is based on an output voltage for the SMPS.

19. The method of claim 15, wherein the SMPS is a boost regulator, and wherein:
- the injected slope compensation signal is generated by a voltage controlled current source (VCCS) with a pre-defined conductance;
- the peak current limit threshold adjustment signal is generated by a VCCS with a substantially identical pre-defined conductance; and
- the peak current limit threshold adjustment signal is based on a difference between an output voltage and an input voltage for the SMPS.

20. The method of claim 15, wherein the SMPS is a bi-directional buck/boost regulator with high and low voltage rails, in which, for buck mode, the high voltage rail is an input rail, and the low voltage rail is an output rail, and for boost mode, the low voltage rail is the input rail and the high voltage rail is the output rail, and wherein:
- the injected slope compensation signal is generated by a voltage controlled current source (VCCS) with a pre-defined conductance;
- the peak current limit threshold adjustment signal is generated for the high and low voltage rails using a high voltage VCCS driven by a difference between the high voltage rail and the low voltage rail, and a low voltage VCCS driven by the low voltage rail.

* * * * *